(12) United States Patent
Nakamura et al.

(10) Patent No.: US 6,346,164 B1
(45) Date of Patent: Feb. 12, 2002

(54) METHOD OF VACUUM-LAMINATING ADHESIVE FILM

(75) Inventors: Shigeo Nakamura; Kiyonori Furuta, both of Kawasaki (JP)

(73) Assignee: Ajinomoto Co., Inc., Tokyo (JP)

( * ) Notice: Subject to any disclaimer, the term of this patent is extended or adjusted under 35 U.S.C. 154(b) by 0 days.

(21) Appl. No.: 09/439,093

(22) Filed: Nov. 12, 1999

(30) Foreign Application Priority Data

Dec. 2, 1998 (JP) .......................................... 10-342413

(51) Int. Cl.[7] .............................................. B32B 31/20
(52) U.S. Cl. ...................... 156/289; 156/220; 156/286
(58) Field of Search ............................... 156/219, 220, 156/285, 286, 289, 381, 382

(56) References Cited

U.S. PATENT DOCUMENTS

| 4,101,364 | A | * | 7/1978 | Tsukada et al. ............. 156/286 |
| 4,127,436 | A | * | 11/1978 | Friel ...................... 156/285 X |
| 4,234,373 | A | * | 11/1980 | Reavill et al. |
| 4,681,649 | A | * | 7/1987 | Fazlin ......................... 156/285 |
| 4,700,474 | A | * | 10/1987 | Choinski |
| 4,806,195 | A | * | 2/1989 | Namysl |
| 4,946,524 | A | * | 8/1990 | Stumpf et al. .......... 156/286 X |
| 4,986,869 | A | * | 1/1991 | Tomisawa et al. ...... 156/285 X |
| 5,164,284 | A | * | 11/1992 | Briguglio et al. |
| 5,292,388 | A | * | 3/1994 | Candore |
| 6,041,840 | A | * | 3/2000 | Ogawa ................... 156/285 X |

FOREIGN PATENT DOCUMENTS

| JP | 10-93252 | * | 4/1998 |
| TW | 342583 | | 2/1986 |

* cited by examiner

*Primary Examiner*—Curtis Mayes
(74) *Attorney, Agent, or Firm*—Oblon, Spivak, McClelland, Maier & Neustadt, P.C.

(57) ABSTRACT

Adhesive films may be vacuum laminated on a circuit substrate by sheeting an adhesive film having the same size as or a smaller size than that of a circuit substrate in a state wherein the surface of a resin composition in the adhesive film is allowed to provisionally partially adhere to one surface or both surfaces of the circuit substrate and disposing a protecting film having an area larger than that of the adhesive film on the adhesive film provisionally adhering to the circuit substrate so that the center of the protecting film is disposed at substantially the same position as that of the center of the adhesive film, followed by vacuum laminating under heating and pressing conditions.

19 Claims, 2 Drawing Sheets

METHOD OF VACUUM-LAMINATING ADHESIVE FILM

BACKGROUND OF THE INVENTION

1. Field of Industrial Utilization

The present invention relates to a method of vacuum-laminating a film-like adhesive on an inner-layer circuit pattern in a method of manufacturing a multilayered printed wiring board of a build-up system in which conductive circuit layers and insulating layers are alternately piled up.

2. Prior Art

In a known conventional method of manufacturing a multilayered printed wiring board, several prepreg sheets formed by impregnating glass cloth with epoxy resin in stage B are laminated/pressed as insulating adhesive layers on an inner-layer circuit board with a circuit formed thereon, and the layers are connected via through holes. In the method, however, since heating and pressure molding are performed during the laminating/pressing, a large scale equipment and a long time are required, which increases cost. Additionally, since the glass cloth having a relatively high permittivity is used in the prepreg sheet, reduction of interlayer thickness is limited. Another problem is that uncertainty of insulation is caused by migration among the through holes (CAF).

To solve the problem, recently technique for manufacturing a multilayered printed wiring board of a build-up system by alternately piling up organic insulating layers on conductive layers of an inner-layer circuit board has been noted. In Japanese Patent Application Laid-open No. 64960/1996, there is provided a method of applying an undercoat adhesive, tentatively drying, laminating a film-like additive adhesive, heating and hardening, roughing with alkaline oxidizing agent, and forming a conductive layer by plating to manufacture a multilayered printed wiring board. Moreover, in Japanese Patent Application Laid-open No. 202418/1995, there is disclosed a method of laminating, on an inner-layer circuit board, an adhesive copper foil obtained by forming an adhesive layer of polymeric epoxy resin and liquid epoxy resin on a copper foil to manufacture a multi-layered printed wiring board. On the other hand, in Japanese Patent Application Laid-open No. 97927/1999, the present inventors have disclosed an interlayer adhesive film for a multilayered printed wiring board and a productive method of manufacturing the multilayered printed wiring board using the interlayer adhesive film, in which coating of an inner-layer circuit pattern and filling of surface via holes and/or through holes with resin can be performed simultaneously. When the adhesive films are vacuum-laminated under heating and pressurizing conditions, there is a problem that the adhesive bleeds from end portions of the adhesive films to soil press surfaces, because the adhesive is provided with thermal fluidity. To solve the problem, in Japanese Patent Application Laid-open No. 97927/1999, there is proposed a method of providing about 5 mm or more of a support base film portion with no resin on both ends or one end of the adhesive film to prevent the adhesive from bleeding. This method, however, has a disadvantage that the productivity in manufacturing the adhesive films is deteriorated.

SUMMARY OF THE INVENTION

An object of the present invention is to provide a method for easily reducing adhesive bleeding in a method of laminating, on a patterned circuit base, an adhesive film face of a laminate constituted of a support base film and an adhesive film, using a heatable and pressable vacuum laminating device.

As a result of various studies on a method of preventing the adhesive bleeding, it has been found that the adhesive bleeding can be prevented by providing a bleeding preventive sheet between at least one press plate of the vacuum laminating device and the support base film of the laminate in such a manner that the bleeding preventive sheet fails to spread out of any point of a surface periphery of the laminate and to stain with the bleeding to the surface of a laminating metal roll. The present invention has thus been completed.

Specifically, a first embodiment of the present invention provides a method of vacuum-laminating an adhesive film which comprises a supporting base film disposed on at least one surface of a pattern-processed circuit substrate and a resin composition having a thermal flowability and being in the solid state at normal temperature disposed on the surface of said supporting base film so that said resin composition is laminated under heating and pressing conditions, said method comprising the steps of:
(1) sheeting said adhesive film having the same size as or a smaller size than that of said circuit substrate in a state wherein the surface of said resin composition in said adhesive film is allowed to provisionally partially adhere to one surface or both surfaces of said circuit substrate; and
(2) disposing a protecting film having an area larger than that of said adhesive film on said adhesive film provisionally adhering to said circuit substrate so that the center of said protecting film is disposed at substantially the same position as that of the center of said adhesive film, followed by vacuum laminating under heating and pressing conditions.

A second embodiment of the present invention provides an adhesive film vacuum laminating method, further comprising a post-treatment step in which said adhesive film is smoothed by heating and pressing using a pressing metal plate or a laminating metal roll which can be used even when a protecting film having an area larger than that of said adhesive film is disposed between said supporting base film and said pressing metal plate or laminating metal roll, wherein said adhesive film comprises said supporting base film and said resin composition having a thermal flowability and being in the solid state at normal temperature disposed on the surface of said supporting base film and is vacuum laminated in the order of supporting base film/resin composition/circuit substrate.

BRIEF DESCRIPTION OF THE DRAWINGS

In FIGS. 1 and 2,
1 Pressing metal plate,
2 Protecting film matte-treated and/or emboss-processed,
3 Inner layer circuit substrate in which an adhesive film is vacuum laminated, and
4 Laminating metal roll.

DETAILED DESCRIPTION OF THE INVENTION

Figure 1:
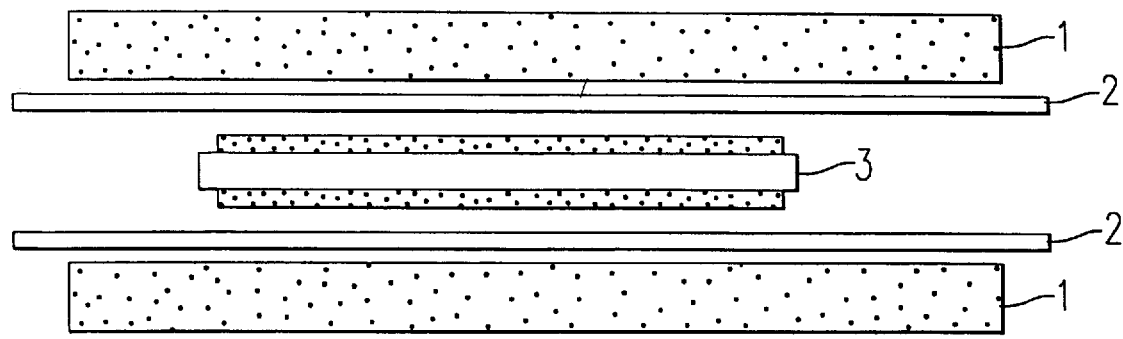
FIG. 1 is a schematic view illustrating a step in which an adhesive film is smoothed by heating and pressing the circuit substrate in which the adhesive film is laminated in a state such that a protecting film having an area larger than that of the adhesive film is disposed between the circuit substrate and a pressing metal plate.

The bleeding preventive sheet for use in the present invention may be fixed to the press plate of the vacuum laminating device or independently provided. A press mechanism in the vacuum laminating device may be a system in which one press plate is movable or in which a pair of press plates are movable. In the present invention, hardness of the press plate is important. It is undesirable that the press plate is excessively hard. A heat-resistant rubber material is generally used. For the material of the bleeding preventive sheet, for example, PET film with thickness of 0.1 to 1 mm or heat-resistant rubber with thickness of 1 to 2 mm is used.

One surface or both surfaces of the circuit base formed by laminating the adhesive film of the laminate constituted of the support base film and the adhesive film may be patterned. When both surfaces are patterned, by using two laminates in total, the adhesive film of the laminate constituted of the support base film and the adhesive film can simultaneously be laminated on both surfaces of the patterned circuit base.

The laminate for use in the present invention is formed of the support base film and the adhesive film. Furthermore, in order to prevent soiling and keep quality at the time of transport or storage, the adhesive film is coated with a protective film. The support base film and the adhesive film may be laminated to each other while having the same area, but the support base film is usually designed to have a slightly larger area because the support base film needs to be removed after the laminate is laminated on the circuit base. In this state, the films are laminated to each other.

The adhesive film for use in the present invention is a resin composition which is solid at ordinary temperatures and has thermal fluidity. The resin composition is not especially limited as long as it is mainly composed of a thermosetting resin and/or a polymeric resin, softened by heating, able to form a film, and further thermoset to satisfy heat resistance, electric properties and other properties required for an interlayer insulating material. Exemplified are epoxy resins, acrylic resins, polyimide resins, polyamide-imide resins, polycyanate resins, polyester resins, thermosetting polyphenylene ether resins, and the like. Two types or more may be combined for use, or an adhesive film layer having a multilayered structure may be formed. Above all, the epoxy resin is superior in reliability and cost as the interlayer insulating material, and the epoxy resin composition described in Japanese Patent Application Laid-open No. 97927/1999 is preferable.

The adhesive film of the laminate for use in the present invention can be prepared in a known conventional method in which after resin varnish dissolved in predetermined organic solvent is applied to a support base film used as a support, heating and/or hot air spraying is performed to dry the solvent, and a resin composition solid at ordinary temperatures is formed. In this case, almost no organic solvent is residual in the manufactured laminate. The solvent is removed to a degree to which operation environment or safety is not influenced in the subsequent laminating operation.

Examples of the support base film constituting the laminate of the present invention include polyethylene, polyvinyl chloride and another polyolefin; polyethylene terephthalate and another polyester; polycarbonate; mold release paper, copper foil, aluminum foil and another metal foil; and the like. The thickness of the support base film is usually in the range of 10 to 150 $\mu$m. Additionally, mat processing, corona processing, or mold release processing may be applied to the support base film. The thickness of the resin composition solid at ordinary temperatures is usually equal to or larger than a conductor thickness of the inner-layer circuit base to be laminated, and in the range of the conductor thickness of 10 to 120 $\mu$m. The adhesive film of the present invention formed of the resin composition solid at ordinary temperatures and the support base film is rolled up for storage as it is or after a protective film is further laminated on the other surface of the resin composition.

In the provisionally adhering step in which the adhesion film having the same size as or a smaller size than that of the circuit substrate is sheeted in a state wherein the surface of the resin composition in the adhesive film is allowed to partially adhere to one surface or both surfaces of the circuit substrate, there can be used a commercially available auto-cut laminator for a dry film. The auto-cut laminator is used in a way such that the adhesive film in the form of a roll, which has the same width as or a smaller width than the width of the substrate, is cut into a desired size under conditions wherein heating and pressing are applied only to the provisionally adhering portion of the adhesive film not to the laminating roll in the auto-cut laminator.

Figure 3:
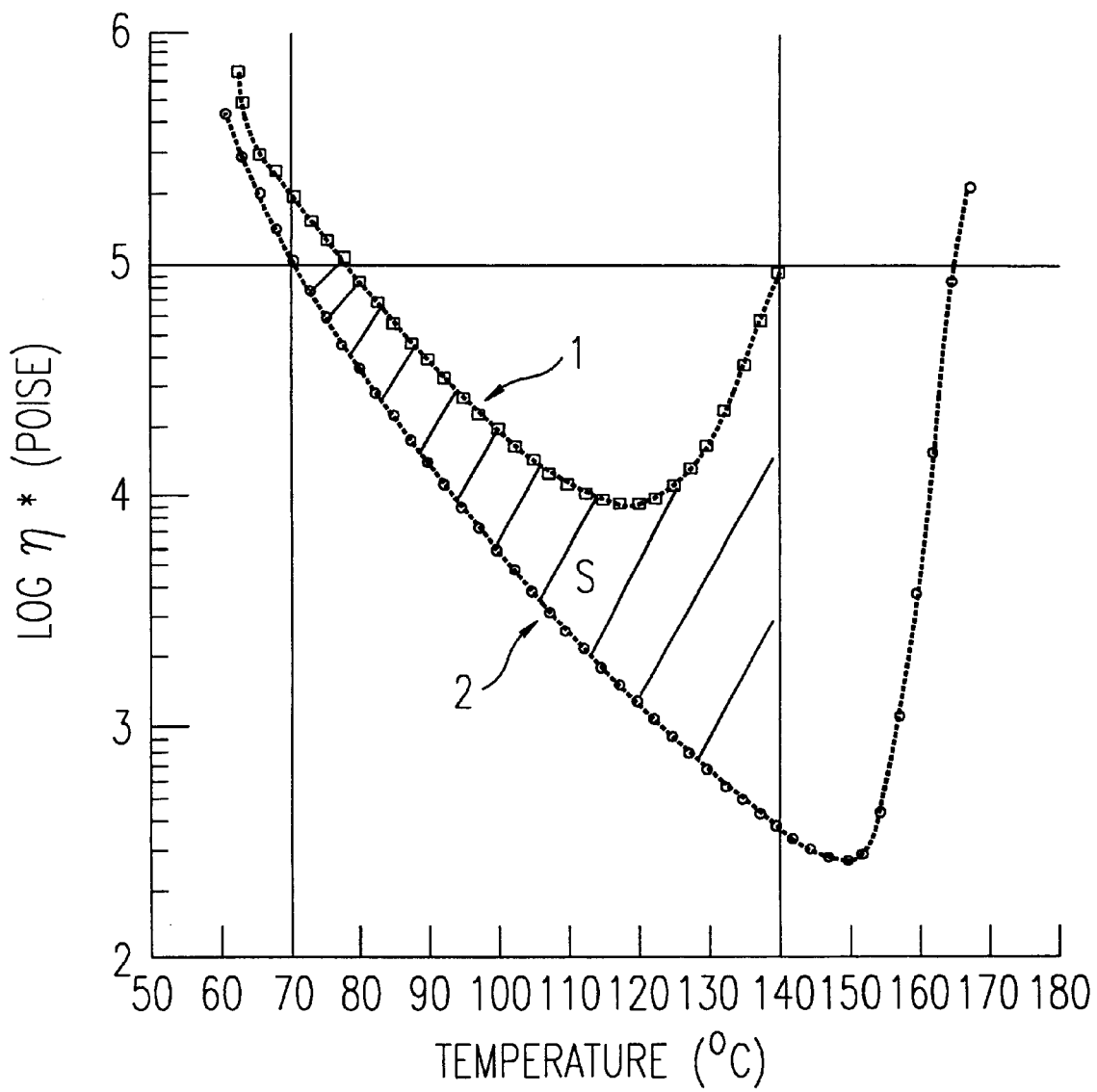
FIG. 3 is a dynamic viscoelasticity curve obtained by measurement using apparatus type: Rhesol-G3000 manufactured and sold by U.B.M. Co., Ltd. In this dynamic viscoelasticity curve, the upper limit curve (1) indicates physical properties of the resin composition layer which is treated under conditions wherein the average drying temperature is 100° C. and the treatment time is 10 minutes, and the lower limit curve (2) indicates those of the resin composition layer which is treated under conditions wherein the average drying temperature is 100° C. and the treatment time is 5 minutes. The measurement conditions are such that the rate of temperature rise is 5° C./min, the starting temperature is 60° C., the measurement temperature interval is 2.5° C., and the vibration is 1 Hz/deg.

The preferred physical properties of the resin composition can be represented by the relationship between a temperature and a melt viscosity obtained by the measurement of dynamic viscoelasticity, and the hatched region S shown in FIG. 3 attached to the present specification indicates the preferred range in respect of the resin composition. The measurement of dynamic viscoelasticity was conducted using apparatus type: Rhesol-G3000 manufactured and sold by U.B.M. Co., Ltd. The upper limit of the dynamic viscoelasticity curve indicates physical properties of the resin composition layer which is treated under conditions wherein the average drying temperature is 100° C. and the treatment time is 10 minutes, whereas the lower limit indicates those of the resin composition layer which is treated under conditions wherein the average drying temperature is 100° C. and the treatment time is 5 minutes. From an experimental point of view, a region which lies between this curve and falls in a range such that the melt viscosity is 100,000 poises or less and the melting temperature is 140° C. or less indicates physical properties of the resin composition layer preferably used in the present invention. When the melt viscosity of the resin composition is 100,000 poises or more, the resin composition layer becomes too hard. In such a case, with respect to the vacuum-laminated adhesive film obtained by the method of the present invention, satisfactory adhesion properties between the pattern on the circuit substrate and the resin composition layer cannot be obtained. When the vacuum laminating is conducted at a temperature 140° C. or more, the obtained laminated circuit substrate is disadvantageously likely to suffer a damage caused by an exposure to a high temperature.

In the step in which a protecting film having an area larger than that of the adhesive film is disposed on the adhesive film provisionally adhering to the circuit substrate so that the center of the protecting film is disposed at substantially the same position as that of the center of the adhesive film, followed by vacuum laminating under heating and pressing conditions, there can be used commercially available vacuum laminating machines, such as a vacuum pressing machine manufactured and sold by Meiki Co., Ltd. and a vacuum laminator manufactured and sold by Taisei Laminator Co., Ltd. In the laminating operation, a protecting film having a width larger than the width of the adhesive film in the form of a roll is set on the base roll of a machine and the circuit substrate on which an adhesive film is sheeted is set in the machine, and then, the resin composition in the solid state at normal temperature is laminated by heating and pressing through both of the protecting film and the supporting base film. When the lamination is performed under conditions wherein the resin flow during the lamination has the same magnitude as or a larger magnitude than the thickness of the conductor in the inner layer circuit, an excellent coating on the pattern of the inner layer circuit can be achieved. In this case, an exudation of the adhesive occurs from the edge of the adhesive film; however, by virtue of the presence of the protecting film which has a size larger than that of the adhesive film, an adherence of the exuded resin to the pressing surface and laminating roll can be prevented, so that it becomes possible to continuously perform a vacuum lamination under clean conditions. Examples of protecting films include polyolefin, such as polypropylene; polyester, such as polyethylene terephthalate; polycarbonate; a release paper; and a metal foil, such as an aluminum foil. With respect to the thickness of the protecting film, the range of from 5 to 100 $\mu$m is preferred. Further, the protecting film may be matte-treated or release-treated.

Figure 2:
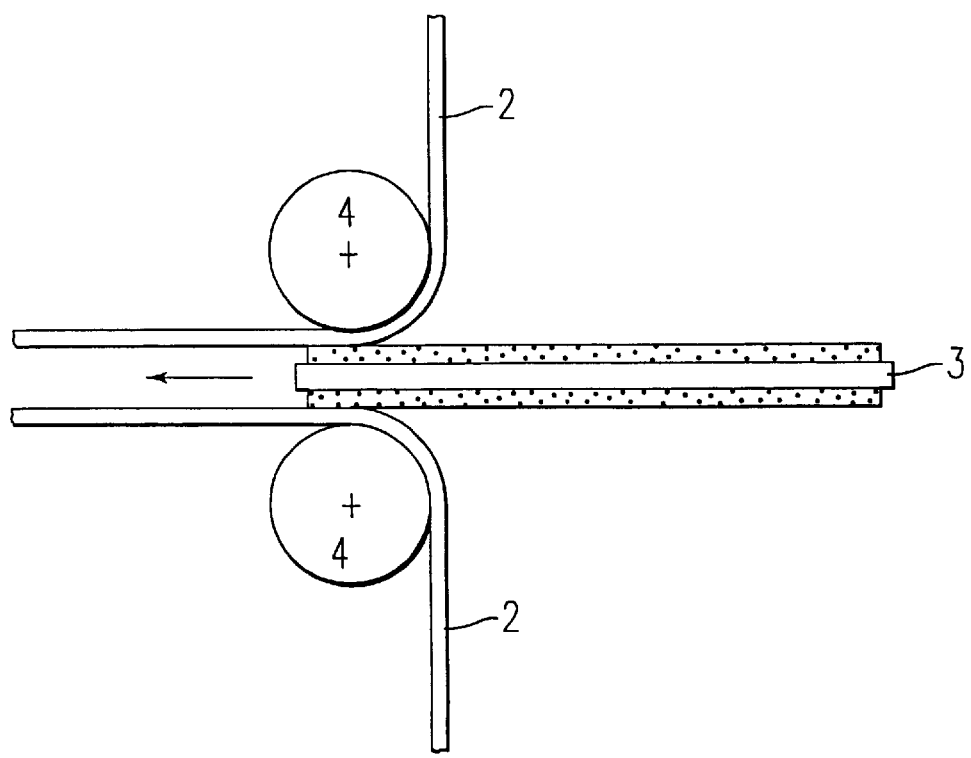
FIG. 2 is a schematic view illustrating a step in which an adhesive film is smoothed by heating and pressing the circuit substrate in which the adhesive film is laminated in a state such that a protecting film having an area larger than that of the adhesive film is disposed between the circuit substrate and a laminating metal roll.

By the vacuum laminating, the resin composition layer adheres to the circuit substrate, but the surface smoothness of the contacting surface of the resin composition layer with the supporting base film is sometimes lowered. For solving such a problem, the adhesive film is smoothed by heating and pressing the circuit substrate, in which the adhesive film is vacuum laminated, in a state such that a protecting film having an area larger than that of the adhesive film is disposed between the circuit substrate and a pressing metal plate and/or a laminating metal roll. As such a machine, there can be used commercially available laminating machines, such as a steam platen pressing machine and a heating and pressing type laminator. FIG. 1 shows a schematic view illustrating a lamination using a metal plate, and FIG. 2 shows a schematic view illustrating a lamination using a metal roll. In the smoothing operation, the resin composition in the solid state at normal temperature is smoothed by heating and pressing the circuit substrate, in which the adhesive film is vacuum laminated, through both of the protecting film and the supporting base film. By pressing and/or laminating the circuit substrate under heating and pressing conditions which are similar to or severer than those in the vacuum laminating, the contacting surface of the resin composition layer with the supporting base film can be smoothed.

Examples of protecting films include polyolefin, such as polyethylene and polypropylene; polyester, such as polyethylene terephthalate; polycarbonate; a release paper; and a metal foil, such as an aluminum foil. The protecting film is used for preventing the metal plate and/or metal roll from suffering a damage due to foreign matter and a stain due to an exudation of an adhesive. With respect to the thickness of the protecting film, the range of from 5 to 100 $\mu$m is preferred.

The method of vacuum laminating an adhesive film of the present invention comprises: (1) the first step in which an adhesive film is heated and pressed through the supporting base film by means of a heat resistant rubber, to thereby effect a vacuum lamination; and (2) the second step in which the adhesive film is smoothed by heating and pressing the circuit substrate, in which the adhesive film is vacuum laminated, in a state such that a protecting film having an area larger than that of the adhesive film is disposed between the circuit substrate and a pressing metal plate and/or a laminating metal roll. The first step is performed in vacuum, and then, the second step may also be performed in vacuum. The circuit substrate, in which the adhesive film is vacuum laminated, obtained in the first step may be removed and placed in the atmosphere before the second step. In such a case, the second step may be performed under vacuum or not under vacuum but under atmospheric conditions. In these cases, a supporting base film or/and a protecting film which are matte-treated and/or emboss-processed can be advantageously used. When at least one film surface selected from the contacting surface of the supporting base film and that of the protecting film is matte-treated and/or emboss-processed, the removal of air from both of the protecting film and the supporting base film can be facilitated, so that the productivity in the smoothing step is improved. Further, the protecting film can be used in the form of layers.

The method of the present invention, in which an adhesive film is vacuum laminated on a pattern-processed circuit substrate, is not limited to the case where an interlayer adhesive film for build-up is used, but, needless to say, the method of the present invention can also be applied to the use of a general adhesive film having a thermal flowability, for example, a dry film, such as a solder resist.

EXAMPLES

Examples of the present invention will be described hereinafter, but the present invention is not limited to the examples.

[Adhesive Film Manufacturing Example]

Stirred, heated and dissolved into MEK were 20 parts of liquid bisphenol A type epoxy resin (Epycoat 828EL manufactured by Yuka Shell Epoxy Kabushiki Kaisha), 20 parts of brominated bisphenol A type epoxy resin (YDB-500 by Tohto Kasei Kabushiki Kaisha), 20 parts of cresol novolac type epoxy resin (epoxy equivalent amount of 215, softening temperature of 78° C., Epychron N-673 manufactured by Dainippon Ink & Chemicals, Inc.), and 15 parts of terminal epoxidized polybutadiene rubber (Denalex R-45EPT manufactured by Nagase Kasei Kogyo Kabushiki Kaisha). Applied to this were 50 parts of brominated phenoxy resin varnish (nonvolatile content of 40 wt %, bromine content of 25 wt %, solvent composition of xylene:methoxy propanol:MEK=5:2:8, YPB-40-PXM40 manufactured by Tohto Kasei Kabushiki Kaisha), 4 parts of epoxy hardener or 2,4-diamino-6-(2-methyl-1-imidazolylethyl)-1,3,5-triazine isocyanuric acid additive, further 2 parts of finely-ground silica, 4 parts of antimony trioxide, and 5 parts of calcium carbonate. A resin composition varnish was thus prepared. The varnish was applied to 38 $\mu$m thick PET films with a roller coater to provide thickness values after dry of 42 and 72 $\mu$m, and dried at 80 to 120° C., so that 80 and 110 $\mu$m thick adhesive films were obtained Comparative Example 1

An adhesive film in the form of a roll obtained in Production Example was sheeted, in a size of 507 (width)× 336 mm, on the both surfaces of a glass-epoxy inner layer circuit substrate (conductor thickness: 18 $\mu$m), which is pattern-processed and has a size of 510×340 mm, by means of an auto-cut laminator manufactured and sold by Somar Corp. under conditions wherein the temperature of the provisionally adhering portion was 70° C., the pressing time was 5 seconds, and the laminating roll was used at room temperature without load. Then, the adhesive film was simultaneously laminated on the both surfaces of the substrate by means of Vacuum Applicator 725 manufactured and sold by Morton International Inc. under conditions wherein the temperature was 80° C. and the pressing time was 6 seconds. At that time, an unfavorable phenomenon occurred in which the resin exuded from the film edge adhered to the pressing surface and the resultant resin powder adhered to the laminated substrate during the continuously repeated laminating operation. After cooling to about room temperature, a polyethylene terephthalate film was released, and the surface roughness of the adhesive surface was measured by means of a surface roughness measuring apparatus manufactured and sold by Tokyo Seimitsu Co., Ltd. under conditions wherein the line/space ratio was 320/320 $\mu$m. As a result, it was found that the maximum high of the surface roughness is 8 $\mu$m.

Comparative Example 2

An adhesive film in the form of a roll obtained in Production Example was set on the bilateral base rolls in a vacuum pressing machine MVLP manufactured and sold by Meiki Co., Ltd. A glass-epoxy inner layer circuit substrate (conductor thickness: 18 $\mu$m), which is pattern-processed and has a size of 510×340 mm, was also set in the machine log sideways, and the adhesive film was simultaneously laminated on the both surfaces of the substrate under conditions wherein the temperature was 70° C., the pressure was 3 kg, and the pressing time was 6 seconds. At that time, an unfavorable phenomenon occurred in which the resin exuded from the film edge adhered to the pressing surface and the resultant resin powder adhered to the laminated substrate during the continuously repeated laminating operation.

Comparative Example 3

An adhesive film in the form of a roll obtained in Production Example was set on the bilateral base rolls in a vacuum laminator manufactured and sold by Taisei Laminator Co., Ltd. A glass-epoxy inner layer circuit substrate (conductor thickness: 18 $\mu$m), which is pattern-processed and has a size of 510×340 mm, was also set in the machine long sideways, and the adhesive film was simultaneously laminated on the both surfaces of the substrate under conditions wherein the temperature was 120° C., the pressure was 3 kg, and the rate was 30 cm/min. At that time, an unfavorable phenomenon occurred in which the resin exuded from the film edge adhered to the pressing surface and the resultant resin powder adhered to the laminated substrate during the continuously repeated laminating operation. After cutting the adhesive film, a polyethylene terephthalate film was released, and the surface roughness of the adhesive surface was measured by means of a surface roughness measuring apparatus under conditions wherein the line/space ratio was 320/320 $\mu$m. As a result, it was found that the maximum high of the surface roughness is 6 $\mu$m.

Example 1

An adhesive film in the form of a roll obtained in Production Example was sheeted, in a size of 507 (width)× 336 mm, on the both surfaces of a glass-epoxy inner layer circuit substrate (conductor thickness: 18 $\mu$m), which is pattern-processed and has a size of 510×340 mm, in the same manner as in Comparative Example 1. Then, as a protecting film, a polypropylene film having a width of 600 mm and a thickness of 30 $\mu$m was set on the bilateral base rolls in a vacuum pressing machine MVLP manufactured and sold by Meiki Co., Ltd., and the above substrate was also set at a position around the central portion of the protecting film set on the rolls, and then, the adhesive film was simultaneously laminated on the both surfaces of the substrate under conditions wherein the temperature was 70° C., the pressure was 3 kg, and the pressing time was 6 seconds. At that time, the resin exuded from the film adhered to the protecting film during the lamination; however, the vacuum laminating operation could be completed without staining the pressing surfaces. In addition, since the protecting film was continuously conveyed, it was possible to continuously perform the lamination under clean conditions.

Example 2

An adhesive film in the form of a roll obtained in Production Example was sheeted, in a size of 507 (width)× 336 mm, on the both surfaces of a glass-epoxy inner layer circuit substrate (conductor thickness: 18 $\mu$m), which is pattern-processed and has a size of 510×340 mm, in the same manner as in Comparative Example 1. Then, as a protecting film, a polyethylene terephthalate film having a width of 600 mm and a thickness of 25 $\mu$m was set on the bilateral base rolls in a vacuum laminator manufactured and sold by Taisei Laminator Co., Ltd., and the above substrate was also set at a position around the central portion of the protecting film set on the rolls, and then, the adhesive film was simultaneously laminated on the both surfaces of the substrate under conditions wherein the temperature was 120° C., the pressure was 3 kg, and the rate was 30 cm/min. At that time, the resin exuded from the film adhered to the protecting film during the lamination; however, the vacuum laminating operation could be completed without staining the pressing surfaces. In addition, since the protecting film was continuously conveyed, it was possible to continuously perform the lamination under clean conditions.

Example 3

An adhesive film was laminated on a glass-epoxy inner layer circuit substrate (conductor thickness: 35 $\mu$m), which is pattern-processed and has a size of 510×340 mm, in completely the same manner as in Comparative Example 1. Then, as a protecting film, a polypropylene film (maximum height: 3.5 $\mu$m) having both surfaces matte-treated and having a width of 600 mm and a thickness of 15 $\mu$m was set on the bilateral metal plates in a steam platen pressing machine, and the above substrate was also set at a position around the central portion of the pressing metal plate, and then, pressing was performed under conditions wherein the temperature was 90° C., the pressure was 5 kg/cm$^2$, and the pressing time was 20 seconds. After cooling to about room temperature, a polyethylene terephthalate film was released, and the surface roughness of the adhesive surface was measured by means of a surface roughness measuring apparatus under conditions wherein the line/space ratio was 320/320 $\mu$m. As a result, it was found that the maximum high of the surface roughness is less than 2 $\mu$m.

Example 4

An adhesive film was laminated on a glass-epoxy inner layer circuit substrate (conductor thickness: 35 μm), which is pattern-processed and has a size of 510×340 mm, in completely the same manner as in Comparative Example 2. Then, as a protecting film, a polyethylene terephthalate film (maximum height: 5 μm) having both surfaces matte-treated and having a width of 600 mm and a thickness of 25 μm was set on the bilateral base rolls in a chrome-plated metal roll type laminator, and the above substrate was also set at a position around the central portion of the protecting film set on the rolls, and then, the surface of the adhesive film was subjected to smoothing treatment under conditions wherein the temperature was 135° C., the pressure was 3 kg/cm$^2$, and the rate was 50 cm/min. After cooling to about room temperature, a polyethylene terephthalate film was released, and the surface roughness of the adhesive surface was measured by means of a surface roughness measuring apparatus under conditions wherein the line/space ratio was 320/320 μm. As a result, it was found that the maximum high of the surface roughness is less than 2 μm.

From the results of Comparative Examples 1 to 3, it is found that when a lamination of an adhesive film is performed using a commercially available vacuum laminating machine in accordance with the conventional method, the pressing surface and the laminating roll are disadvantageously stained due to an exudation of an adhesive. On the other hand, as apparent from the results of Examples 1 and 2, by the method of the present invention, a continuous laminating operation for an adhesive film having a thermal flowability can be performed under clean conditions. Further, from the results of Comparative Examples 1 to 3, it is also found that when a lamination of an adhesive film is performed using a commercially available vacuum laminating machine in accordance with the conventional method, there is a limitation with respect to the surface smoothness of the adhesive. On the other hand, as apparent from the result of Examples 3 and 4, by the method of the present invention, an adhesive film having a thermal flowability can be laminated in a state such that the surface of the adhesive is extremely smooth.

Effects of the Invention

According to the method of the present invention, a laminating operation for an adhesive film can be easily, conveniently performed without suffering stain of the pressing surface and the laminating roll due to an exudation of an adhesive. By the method of the present invention, a vacuum laminating operation for an adhesive film can be performed under clean conditions at a high productivity. In addition, by further performing the second step of the post treatment in the present invention, an excellent smoothness of the surface of the adhesive film can be obtained.

What is claimed as new and desired to be secured by Letters Patent is:

1. A method of vacuum-laminating an adhesive film, wherein said adhesive film comprises a supporting base film and a resin composition having a thermal flowability and being in the solid state at normal temperature disposed on the surface of said supporting base film so that said resin composition is laminated on at least one surface of a pattern-processed circuit substrate under heating and pressing conditions, said method comprising the steps of:
(1) sheeting said adhesive film having the same size as or a smaller size than that of said circuit substrate in a state wherein the surface of said resin composition in said adhesive film is allowed to provisionally partially adhere to one surface or both surfaces of said circuit substrate;
(2) disposing a protecting film having an area larger than that of said adhesive film on said adhesive film provisionally adhering to said circuit substrate so that the center of said protecting film is disposed at substantially the same position as that of the center of said adhesive film, followed by vacuum laminating under heating and pressing conditions; and post-treating said adhesive film to smooth said adhesive film by heating and pressing using a pressing metal plate or a laminating metal roll which can be used even when a protecting film having an area larger than that of said adhesive film is disposed between said supporting base film and said pressing metal plate or laminating metal roll, wherein said adhesive film comprises said supporting base film and said resin composition having a thermal flowability and being in the solid state at normal temperature disposed on the surface of said supporting base film and is vacuum laminated in the order of supporting base film/resin composition/circuit substrate.

2. The adhesive film vacuum laminating method according claim 1, wherein at least one film surface selected from the contacting surface of said supporting base film in said adhesive film which comprises said supporting base film and said resin composition having a thermal flowability and being in the solid state at normal temperature disposed on the surface of said supporting base film and the contacting surface of said protecting film is matte-treated and/or emboss-processed.

3. The method of claim 1, wherein said resin composition is selected from the group consisting of epoxy resins, acrylic resins, polyimide resins, polyamide-imide resins, polycyanate resins, polyester resins, thermosetting polyphenylene ether resins, and mixtures thereof.

4. The method of claim 1, wherein said resin composition is an epoxy resin.

5. The method of claim 1, wherein said supporting base film is selected from the group consisting of polyolefins, polyesters, polycarbonates, mold release papers, and metal foils.

6. The method of claim 5, wherein said resin composition is selected from the group consisting of epoxy resins, acrylic resins, polyimide resins, polyamide-imide resins, polycyanate resins, polyester resins, thermosetting polyphenylene ether resins, and mixtures thereof.

7. The method of claim 5, wherein said resin composition is an epoxy resin.

8. The method of claim 1, wherein said supporting base film is a polyolefin selected from the group consisting of polyethylene and polyvinyl chloride.

9. The method of claim 8, wherein said resin composition is selected from the group consisting of epoxy resins, acrylic resins, polyimide resins, polyamide-imide resins, polycyanate resins, polyester resins, thermosetting polyphenylene ether resins, and mixtures thereof.

10. The method of claim 8, wherein said resin composition is an epoxy resin.

11. The method of claim 1, wherein said supporting base film is polyethylene terephthalate.

12. The method of claim 11, wherein said resin composition is selected from the group consisting of epoxy resins, acrylic resins, polyimide resins, polyamide-imide resins, polycyanate resins, polyester resins, thermosetting polyphenylene ether resins, and mixtures thereof.

13. The method of claim 11, wherein said resin composition is an epoxy resin.

14. The method of claim 1, wherein said supporting base film is a metal foil selected from the group consisting of copper foil and aluminum foil.

15. The method of claim 14, wherein said resin composition is selected from the group consisting of epoxy resins, acrylic resins, polyimide resins, polyamide-imide resins, polycyanate resins, polyester resins, thermosetting polyphenylene ether resins, and mixtures thereof.

16. The method of claim 14, wherein said resin composition is an epoxy resin.

17. The method of claim 1, wherein said supporting base film has a thickness of 10 to 150 $\mu$m.

18. The method of claim 17, wherein said resin composition is selected from the group consisting of epoxy resins, acrylic resins, polyimide resins, polyamide-imide resins, polycyanate resins, polyester resins, thermosetting polyphenylene ether resins, and mixtures thereof.

19. The method of claim 17, wherein said resin composition is an epoxy resin.

* * * * *

UNITED STATES PATENT AND TRADEMARK OFFICE
CERTIFICATE OF CORRECTION

PATENT NO. : 6,346,164 B1  Page 1 of 1
DATED : February 12, 2002
INVENTOR(S) : Nakamura et al.

It is certified that error appears in the above-identified patent and that said Letters Patent is hereby corrected as shown below:

<u>Column 6,</u>
Line 67, insert -- . -- after "obtained"

<u>Column 8,</u>
Line 5, delete "the"

Signed and Sealed this

Fourth Day of June, 2002

Attest:

Attesting Officer

JAMES E. ROGAN
*Director of the United States Patent and Trademark Office*